INVENTOR
SUMIO NISHIDA

BY Paul M. Craig, Jr.
ATTORNEY

INVENTOR
SUMIO NISHIDA

BY Paul M. Craig, Jr.
ATTORNEY

United States Patent Office 3,560,280
Patented Feb. 2, 1971

3,560,280
METHOD OF SELECTIVE REMOVAL OF OXIDE COATINGS IN THE MANUFACTURE OF SEMICONDUCTOR DEVICES

Sumio Nishida, Kodaira-shi, Japan, assignor to Hitachi, Ltd., Tokyo, Japan, a corporation of Japan Continuation of application Ser. No. 594,875, Nov. 16, 1966. This application Nov. 21, 1969, Ser. No. 872,448
Claims priority, application Japan, Nov. 17, 1965, 40/70,273
Int. Cl. H01l 7/00
U.S. Cl. 156—17 16 Claims

ABSTRACT OF THE DISCLOSURE

An oxide film formed on a semiconductor substrate is selectively etched by diffusing a metal such as aluminum or chromium into the oxide film prior to etching the film. The diffused metal hardens the oxide film and prevents excessive side etching. Other metals such as, for example, zirconium zinc, titanium, molybdenum, rhodium, gold, niobium, calcium, magnesium and barium and the oxides of these metals may be employed.

Figure 1A:
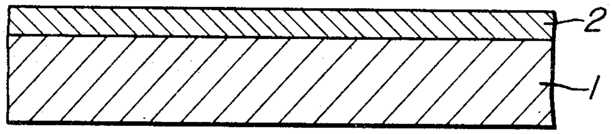

This application is a continuation of Ser. No. 594,875 filed on Nov. 16, 1966, now abandoned.

This invention relates to improvements in the method of selectively removing predetermined portions of oxide films formed on semiconductor substrates.

In the manufacture of semiconductor devices such as planar transistors and semiconductor integrated circuits, it is common practice to selectively remove a predetermined portion of the oxide film covering the surface of a semiconductor substrate by use of the photo-etching technique for thereby boring a very fine hole through the oxide film. Then an impurity for determining the type of conductive mode of the semiconductor is admitted through the hole bored through the oxide film into the semiconductor substrate or a very fine electrode is deposited on the semiconductor substrate surface through such hole. With the recent tendency toward smaller sizes or more miniaturized semiconductor devices, higher precision of photo-etching work has been increasingly demanded.

However a problem has arisen in conjunction with the etching work that the diameter of a hole bored through the oxide film on a semiconductor substrate becomes greater than is required due to excessive etching of the oxide film in its lateral direction and the working precision of the photo-etching is thereby lowered. In other words, this etching of the side walls of the hole gives rise to the inability of precise control of impurity diffusion through the oxide film acting as a mask and thus results in the impossibility of obtaining a diffused region of predetermined shape. The above lateral etching is also undesirable due to the difficulty of uniform vacuum deposition of electrode metal on the semiconductor becaust the electrode material can not be deposited on the semiconductor surface under a desired state of spread and further the photo-resist material may sometimes droop downwardly along the side walls of the hole in the oxide film.

It is therefore an object of the present invention to minimize the lateral etching of the side walls of a hole in the oxide film in the etching process and to thereby improve the precision of etching work.

Another object of the present invention is to obtain semiconductor devices of further miniaturized structure yet having excellent electrical properties by the attainment of the improvement in the precision of etching working.

In order to attain these objects, a metal of some kind or an oxide of such metal is caused to penetrate into the oxide film in accordance with the present invention. According to experiments made by the inventor, metals satisfactorily usable for this purpose are aluminum, chromium, zirconium, zinc, titanium, molybdenum, rhodium, gold, niobium, calcium, magnesium and barium. Penetration or diffusion of these metals or their oxides from the surface of the oxide film is so effective that the oxide films shows an improved resistance to acids with the result that lateral etching of the side walls of a hole is minimized and etching working at high precision can be accomplished.

Figure 1B:
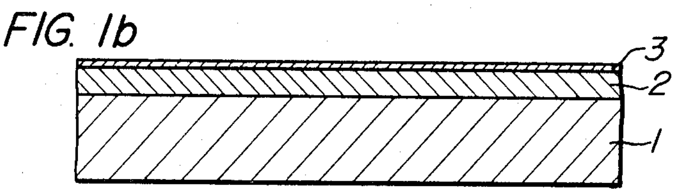
Figure 1C:
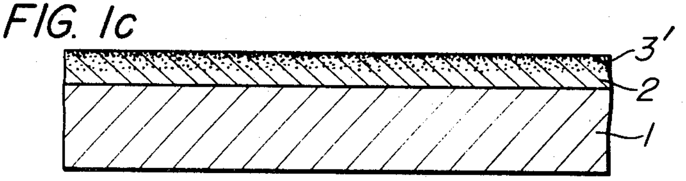
Figure 1D:
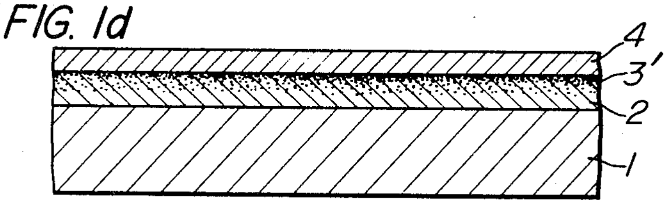
Figure 1E:
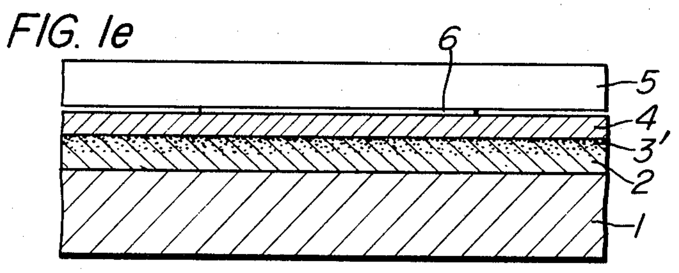
Figure 1F:
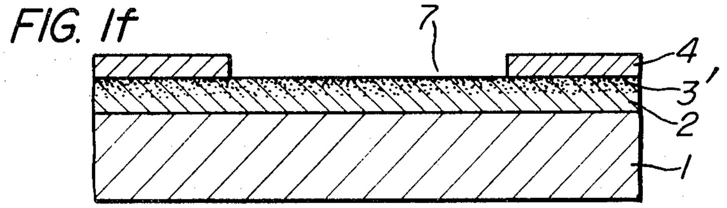
Figure 1G:
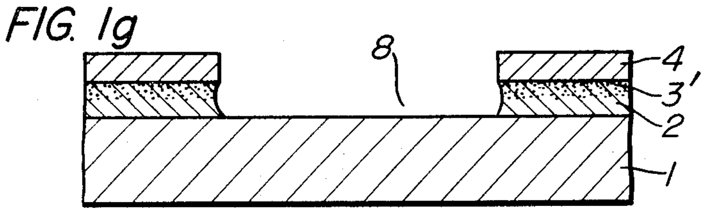
Figure 2:
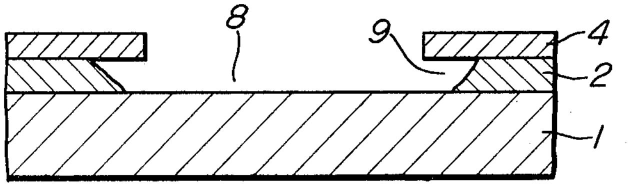

The above and other objects, advantages and features of the present invention will become apparent from the following detailed description of the invention with reference to the accompanying drawings, in which:

FIGS. 1*a–g* are schematic sectional views showing the successive steps of photo-etching according to the method embodying the present invention; and FIG. 2 is a schematic sectional view showing the state of a hole bored by photo-etching according to the conventional method.

Referring to FIG. 1, a semiconductor substrate is designated by reference numeral 1. Silicon is most preferred and widely used as a semiconductor for making planar transistors or semiconductor intergrated circuits therefrom since it easily gives silicon oxide which is a stable insulator. Of course, the semiconductor may be germanium or one of semiconductive intermetallic compounds. An oxide film 2 covers the surface of the semiconductor substrate 1. The silicon oxide described above is typical of the oxide film 2 and can be obtained by oxidizing the surface of the silicon substrate. Alternatively, silicon oxide can be precipitated from a gaseous phase by thermal decomposition of organo-oxysilane. This latter method is advantageous for use with a semiconductor which is either germanium or an intermetallic compound. The oxide film referred to herein is not limited to the film of silicon oxide, but includes an oxide film containing therein an oxide of lead or an alkali metal or an oxide film which is vitrified at its surface or throughout its body with an oxide of lead or an alkali metal.

In FIG. 1, reference numeral 3 designates a layer of one of the above-described metals or their oxides deposited on the oxide film 2 for subsequent penetration into the oxide film 2 in accordance with the method of the invention. The state of penetration of such metal or its oxide into the oxide layer 2 is generally indicated by reference numeral 3'. Reference numerals 4 and 5 designate a photoresist layer and a photographic negative having an opaque portion 6 provided according to a predetermined pattern, respectively.

A few practical examples of the invention will be described hereunder so that the invention can be more clearly understood, and in these examples silicon is employed as the material of the semiconductor substrate for the sake of simplicity of explanation.

EXAMPLE 1

A silicon substrate 1 is first prepared and is heated to a temperature of 1200° C. for about 1 hour in a steam atmosphere at atmospheric pressure to cause formation of a layer or film 2 of silicon oxide about 1 micron thick on the surface of the substrate 1 as shown in FIG. 1*a*. An aluminum layer 3 having a thickness of the order of 10 to 300 angstroms, for example, about 100 angstroms is then vacuum deposited on the surface of the silicon oxide film 2 as shown in FIG. 1*b*.

After vacuum deposition of aluminum, the silicon substrate 1 is heat treated in an oxidizing atmosphere for 60 minutes at a temperature of about 500° to 600° C. However, the above-specified duration of heat treatment is not critical and may be adjusted to a suitable period between 1 to 4 hours depending on the thickness of the oxide film 2 and the amount of aluminum deposition. By this heat treatment, the vacuum deposited aluminum is caused to diffuse into the oxide film 2 in a manner as shown in FIG. 1*c*. Portions 3' in FIG. 1*c* show the state of penetration of aluminum into the oxide film 2. The temperature and duration of the above heat treatment need not be placed under so strict a control, but care should be taken in the selection of the heating period and heating temperature so that aluminum which is a p-type impurity may not penetrate completely through the oxide film 2 to reach the surface of the substrate 1 to thereby convert the type of conductive mode of that portion into the opposite type or p-type. However, such hazardous situation never takes place as far as a temperature and duration in the vicinity of the above-specified values are employed.

Thereafter a layer of photoresist 4 is applied on the oxide film 2 by a method well known in the art and is exposed to light (ultraviolet rays) through a photographic negative 5 as shown in FIG. 1*e* to thereby sensitize those portions which are not covered by an opaque portion 6. The photoresist may for example be one which is sold under the trade name of KPR.

Upon completion of exposure to light, the photoresist layer 4 is developed to provide a hole 7 in the photoresist layer 4 as shown in FIG. 1*f*, and then an etchant including hydrofluoric acid is applied through the hole 7 to etch the silicon oxide film 2 for thereby boring a hole 8 therethrough. The etchant used herein is a mixed solution consisting of 70 cc. of a 50% aqueous solution of hydrofluoric acid and 450 cc. of a 40% aqueous solution of ammonium fluoride, and etching is carried out at room temperature. A better result can be obtained by adding a small amount of a mixed solution of phosphoric acid and hydrochloric acid to an etchant of the kind including an aqueous solution of hydrofluoric acid.

In the oxide film 2 having aluminum diffused thereinto according to the invention, lateral etching of the oxide film 2 hardly took place and the side walls of the hole 8 in the oxide film 2 were substantially uniformly etched and were substantially perpendicular with respect to the substrate surface, as shown in FIG. 1*g*.

When a conventional oxide film without having aluminum penetrated therein is subjected to etching under conditions similar to the above, those portions of the oxide lying at the underside 9 of the photoresist layer 4 are inevitably etched so that the hole thereby bored would have a diameter larger than is expected, as shown in FIG. 2. Further, due to non-uniform etching of the side walls of the hole, the hole has irregular peripheral edge lines and is clumsily finished. This irregular and ragged shape of the hole is detrimental when later subjected to a metal deposition treatment of the kind in which a metal is vacuum deposited on the semiconductor substrate with the photoresist layer 4 left thereon and the photoresist layer 4 is finally removed to leave the metal deposited solely on the semiconductor surface portion within the hole 8. In such a process, the photoresist 4 at the peripheral portions 9 of the hole 8 would droop into the hole 8 to hamper uniform deposition of metal at the peripheral edges of the hole 8. It will be seen that such prior drawback is completely eliminated by the present invention.

EXAMPLE 2

Example 2 relates to use of chromium in lieu of the aluminum employed in Example 1. Chromium is vacuum deposited on an oxide film 2 to a thickness of 10 to 100 angstroms, preferably to a thickness of 30 to 50 angstroms. The semiconductor substrate 1 is then heat treated at a temperature of 700° to 1000° C. for 1 to 4 hours in an oxidizing atmosphere; for example, the substrate is heat treated at 700° C. for 4 hours in such an atmosphere.

Photo-etching is then carried out in a manner similar to the previous case of aluminum deposition. In the case of chromium penetration into the oxide film however, a better result can be obtained by washing the surface of the oxide film with a saturated aqueous solution of aluminum chloride prior to etching for thereby removing any residue of vacuum deposited chromium and by then etching the oxide film with an etchant containing hydrofluoric acid.

As will be understood from the foregoing description, aluminum and chromium have the property of improving the resistance to acids of the oxide layer and show a further effect of protecting the semiconductor surface from the attack of moisture because they form a surface protecting film for semiconductor elements which film acts to restrict adsorption of moisture by the semiconductor elements. Besides the above-described aluminum and chromium, those metal materials such as zirconium, zinc, titanium, molybdenum, rhodium, gold, niobium, calcium, magnesium and barium can behave in the substantially same manner. Any one of these materials may be, singly or in the form of its oxide, deposited by vacuum evaporation or sputtering on the oxide film covering the surface of a semiconductor.

The oxide film having the hole bored in the above manner is used in the next step as a mask for impurity diffusion or an electrode is deposited through this hole in the next step. It will be appreciated that, by virtue of high precision with which the holes can be bored and a uniform width of these holes, it is possible to manufacture semiconductor devices of remarkably high performance at a high production rate of yield.

It is claimed:

1. A method of selectively etching a predetermined portion of an oxide film formed on a semiconductor substrate comprising the steps of vapor-depositing at least one member selected from the group consisting of aluminum, chromium, zirconium, zinc, titanium, molybdenum, rhodium, gold, niobium, calcium, magnesium, barium and oxides thereof on the surface of said oxide film, heating the combination thus obtained in an oxidizing atmosphere to diffuse at least one of the metals and an oxide thereof into said oxide film so that the diffused metal does not reach the surface of said semiconductor substrate, covering the surface of said oxide film thus treated with an etching resist except a predetermined selected portion of the surface, and exposing the oxide film portion not covered with said resist to an etchant containing hydrofluoric acid for thereby selectively removing a portion of said oxide film.

2. A method according to claim 1, in which said oxide film includes silicon oxide therein.

3. A method according to claim 2, in which said oxide film including said silicon oxide is formed in an oxidizing atmosphere by application of heat to a silicon semiconductor.

4. The method of claim 1, wherein the vapor-deposited member is selected from the group consisting of aluminum, chromium, zirconium, zinc, titantium, molybdenum, rhodium, gold, niobium, calcium and magnesium.

5. A method of selectively etching an insulating film including silicon oxide therein formed on a semiconductor substrate comprising the steps of vapor-depositing a layer including at least one of aluminum and an oxide thereof on the surface of said insulating film to a thickness of 10 to 300 angstroms, heating said substrate having said layer thereon at a temperature in the vicinity of 500° to 600° C. for a period of time of from about 1 to 4 hours in an oxidizing atmosphere for thereby diffusing at least one of aluminum and an oxide thereof into said insulating film so that the diffused aluminum does not reach the surface of said semiconductor substrate, covering the surface of said insulating film thus treated with an etching resist except a predetermined selected portion of the surface, and exposing the insulating film portion not covered with said resist to an etchant containing hydrofluoric acid for thereby selectively removing a portion of said insulating film.

6. A method according to claim 5, in which said etchant containing hydrofluoric acid therein further contains a small amount of a mixed solution of phosphoric acid and hydrochloric acid.

7. The method of claim 5, wherein aluminum is vapor deposited on the insulating film.

8. A method of selectively etching an insulating film including silicon oxide therein formed on a semiconductor substrate comprising the steps of vapor-depositing a layer including at least one of chromium and an oxide thereof on the surface of said insulating film to a thickness of 10 to 100 angstroms, heating said substrate having said layer thereon at a temperature in the vicinity of 700° to 1000° C. for a period of time of from about 1 to 4 hours in an oxidizing atmosphere to diffuse at least one of chromium and an oxide thereof into said insulating film so that the diffused chromium does not reach the surface of said semiconductor substrate, covering the surface of said insulating film thus treated with an etching resist except a predetermined selected portion of the surface, and exposing the insulating film portion not covered with said resist to an etchant containing hydrofluoric acid for thereby selectively removing a portion of said insulating film.

9. A method according to claim 8, in which prior to the step of exposing said insulating film to said etchant containing hydrofluoric acid, the surface of said insulating film is washed with a saturated aqueous solution of aluminum chloride.

10. The method of claim 8, wherein chromium is vapor deposited on the insulating film.

11. A method for selectively etching a portion of an insulating film formed on a semiconductor substrate, comprising the steps of:

- forming an insulating film consisting essentially of silicon oxide on a semiconductor substrate;
- vapor-depositing on said insulating film at least one member selected from the group consisting of aluminum, chromium, zinc, titanium, molybdenum, rhodium, gold, niobium, calcium, magnesium, barium and oxides thereof;
- heating the combination thus obtained in an oxidizing atmosphere for a predetermined period of time and at a predetermined temperature to diffuse at least one of the metals and an oxide thereof into said insulating film a distance less than the thickness of said film;
- applying an etching resist film on the thus treated insulating film;
- forming an opening through said etching resist film to expose a preselected portion of said insulating film; and
- applying an etchant including hydrofluoric acid to the combination thus composed to remove the exposed portion of said insulating film.

12. The method of claim 11, wherein the vapor-deposited member is selected from the group consisting of aluminum, chromium, zirconium, zinc, titanium, molybdenum, rhodium, gold, niobium, calcium and magnesium.

13. A method for selectively etching a portion of an insulating film formed on a semiconductor substrate, comprising the steps of:

- forming on a surface of a semiconductor substrate an insulating film consisting essentially of silicon oxide;
- vapor-depositing on said insulating film at least one member selected from the group consisting of aluminum, chromium, zirconium, zinc, titanium, molybdenum, rhodium, gold, niobium, calcium, magnesium, barium and oxides thereof;
- heating the combination thus obtained in an oxidizing atmosphere to diffuse at least one of the metal or an oxide thereof into said insulating film, said heating being discontinued before said metal diffuses to the surface of said substrate;
- covering the surface of said insulating film thus treated with a layer of etching resist material having an opening reaching said insulating film; and
- exposing the combination thus composed to an etchant including hydrofluoric acid to remove the portion of said insulating film not covered with said layer of etching resist material.

14. The method of claim 13, wherein the vapor-deposited member is selected from the group consisting of aluminum, chromium, zirconium, zinc, titanium, molybdenum, rhodium, gold, niobium, calcium and magnesium.

15. A method for manufacturing a semiconductor device comprising the steps of forming on a surface of a semiconductor substrate an insulating film consisting essentially of silicon oxide, vapor-depositing a thin film including at least one of aluminum and an oxide thereof on the surface of said insulating film, heating said combination thus composed in an oxidizing atmosphere at a temperature of at least 500° C. to form an oxide film including at least one of aluminum and an oxide thereof on the insulating film consisting essentially of silicon oxide, covering the oxide film with a layer of an etching resist material having a hole reaching the oxide film, and exposing the combination thus obtained to an etchant including hydrofluoric acid to form an opening through said insulating film.

16. The method of claim 15, wherein aluminum is vapor deposited on the insulating film.

References Cited

UNITED STATES PATENTS

| | | | |
|---|---|---|---|
| 2,846,340 | 8/1958 | Jenny | 156—17X |
| 2,894,862 | 7/1959 | Mueller | 156—17X |
| 3,107,188 | 10/1963 | Hancock | 156—17 |
| 3,193,418 | 7/1965 | Cooper et al. | 148—189 |
| 3,210,225 | 10/1965 | Brixey | 156—17X |
| 3,290,753 | 12/1966 | Chang | 156—17X |

FOREIGN PATENTS

| | | | |
|---|---|---|---|
| 675,444 | 7/1952 | Great Britain | 252—79.2 |

JOHN T. GOOLKASIAN, Primary Examiner

J. C. GIL, Assistant Examiner

U.S. Cl. X.R.

148—189; 156—8